United States Patent
Yang (10) Patent No.: US 8,314,490 B2
(45) Date of Patent: Nov. 20, 2012

(54) CHIP HAVING A BUMP AND PACKAGE HAVING THE SAME

(75) Inventor: Kuo-Pin Yang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 287 days.

(21) Appl. No.: 12/726,777

(22) Filed: Mar. 18, 2010

(65) Prior Publication Data
US 2010/0244244 A1    Sep. 30, 2010

(30) Foreign Application Priority Data

Mar. 25, 2009  (TW) .............................. 98109809 A (51) Int. Cl.
*H01L 23/48*    (2006.01)
*H01L 23/52*    (2006.01)

(52) U.S. Cl. .. 257/737; 257/750; 257/774; 257/E23.021

(58) Field of Classification Search .................. 257/737, 257/774, 750, E23.021
See application file for complete search history.

(56) References Cited

U.S. PATENT DOCUMENTS

| | | | | |
|---|---|---|---|---|
| 5,048,744 A * | 9/1991 | Chang et al. | ................ | 228/123.1 |
| 5,471,092 A * | 11/1995 | Chan et al. | .................... | 257/753 |
| 5,902,686 A * | 5/1999 | Mis | ................ | 428/629 |
| 6,380,061 B1 | 4/2002 | Kobayashi et al. | | |
| 6,476,494 B1 * | 11/2002 | Hur et al. | ...................... | 257/762 |
| 6,586,322 B1 | 7/2003 | Chiu et al. | | |
| 6,696,356 B2 | 2/2004 | Tseng et al. | | |
| 6,740,577 B2 | 5/2004 | Jin et al. | | |
| 6,774,026 B1 | 8/2004 | Wang et al. | | |
| 6,940,169 B2 | 9/2005 | Jin et al. | | |
| 7,034,402 B1 * | 4/2006 | Seshan | .......................... | 257/781 |
| 7,095,045 B2 | 8/2006 | Chiba et al. | | |
| 2003/0124832 A1 | 7/2003 | Tseng et al. | | |
| 2006/0131748 A1 * | 6/2006 | Seshan | .......................... | 257/737 |
| 2008/0136019 A1 * | 6/2008 | Johnson et al. | ................ | 257/737 |
| 2008/0272486 A1 | 11/2008 | Wang et al. | | |
| 2009/0127710 A1 * | 5/2009 | Daubenspeck et al. | ........ | 257/737 |
| 2010/0308459 A1 * | 12/2010 | Bathan et al. | ................. | 257/737 |

FOREIGN PATENT DOCUMENTS

| | | |
|---|---|---|
| CN | 101075595 | 11/2001 |
| CN | 101256997 | 9/2008 |

* cited by examiner

*Primary Examiner* — Nitin Parekh
(74) *Attorney, Agent, or Firm* — McCracken & Frank LLC (57) ABSTRACT

The present invention relates to a chip having a bump and a package having the same. The chip includes a chip body, at least one via, a passivation layer, an under ball metal layer and at least one bump. The via penetrates the chip body, and is exposed to a surface of the chip body. The passivation layer is disposed on the surface of the chip body, and the passivation layer has at least one opening. The opening exposes the via. The under ball metal layer is disposed in the opening of the passivation layer, and is connected to the via. The bump is disposed on the under ball metal layer, and includes a first metal layer, a second metal layer and a third metal layer. The first metal layer is disposed on the under ball metal layer. The second metal layer is disposed on the first metal layer. The third metal layer is disposed on the second metal layer. As the bumps can connect two chips, the chip is stackable, and so the density of the product is increased while the size of the product is reduced.

20 Claims, 6 Drawing Sheets

CHIP HAVING A BUMP AND PACKAGE HAVING THE SAME

BACKGROUND OF THE INVENTION

1. Field of the Invention

The present invention relates to a chip and a package having the same, and more particularly to a chip having a bump and a package having the same.

2. Description of the Related Art

Figure 1:
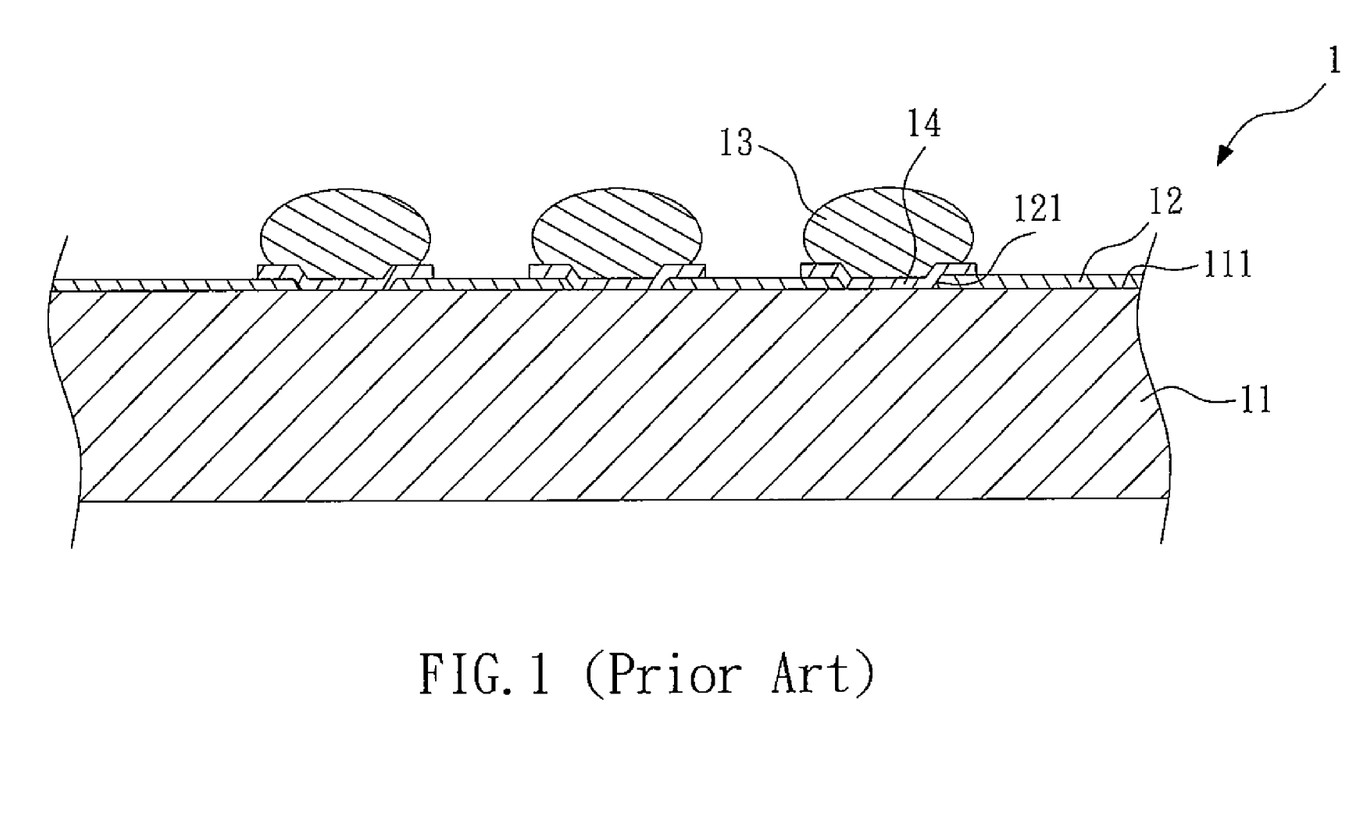
FIG. 1 is a cross-sectional view of a conventional chip having a bump.

FIG. 1 shows a cross-sectional view of a conventional chip having a bump. The conventional chip 1 having a bump comprises a chip body 11, a passivation layer 12, an under ball metal layer 14 and at least one bump 13. The chip body 11 has a surface 111. The passivation layer 12 is disposed on the surface 111 of the chip body 11, and the passivation layer 12 has at least one opening 121. The under ball metal layer 14 is disposed in the opening 121 of the passivation layer 12. The bump 13 is disposed on the under ball metal layer 14.

The disadvantages of the conventional chip 1 having a bump are as follows. The bump 13 is made of single metal, so the melting point of the bump 13 is in a specific range. In a reflow process, the bump 13 will melt at a high temperature so as to facilitate the connection to a pad. However, the melting state of the bump 13 is hard to control, which results in difficulty in achieving precise connection to the pad. Therefore, the yield rate is reduced. Moreover, if the bump 13 is not wrapped in a metal with low activity, the bump 13 will be easily oxidized and thus deteriorate.

Therefore, it is necessary to provide a chip having a bump and a package having the same to solve the above problems.

SUMMARY OF THE INVENTION

The present invention is directed to a chip having a bump. The chip comprises a chip body, a passivation layer, an under ball metal layer and at least one bump. The chip body has a surface. The passivation layer is disposed on the surface of the chip body, and the passivation layer has at least one opening. The under ball metal layer is disposed in the opening of the passivation layer. The bump is disposed on the under ball metal layer, and the bump comprises a first metal layer, a second metal layer, a third metal layer and a fourth metal layer. The first metal layer is disposed on the under ball metal layer. The second metal layer is disposed on the first metal layer. The third metal layer is disposed on the second metal layer. The fourth metal layer is disposed on the third metal layer.

As the bumps can connect two chips, the chip is stackable, and so the density of the product is increased while the size of the product is reduced.

The present invention is further directed to a chip having a bump. The chip comprises a chip body, at least one via, a passivation layer, an under ball metal layer and at least one bump. The chip body has a surface. The via penetrates the chip body, and is exposed to the surface of the chip body. The passivation layer is disposed on the surface of the chip body, and the passivation layer has at least one opening. The opening exposes the via. The under ball metal layer is disposed in the opening of the passivation layer, and is connected to the via. The bump is disposed on the under ball metal layer. The bump comprises a first metal layer, a second metal layer and a third metal layer. The first metal layer is disposed on the under ball metal layer. The second metal layer is disposed on the first metal layer. The third metal layer is disposed on the second metal layer.

Because of the via, the bump can be formed on both the surface and an opposite surface of the chip body, and a stacking process can be conducted so as to reduce the size of the product.

The present invention is further directed to a package having a chip with a bump. The package comprises a substrate, at least one electrical connector, a first chip and a second chip. The substrate has an upper surface and a bottom surface. The electrical connector is disposed on the upper surface of the substrate. The first chip is disposed on the electrical connector, and comprises a chip body, at least one via, a passivation layer, an under ball metal layer and at least one bump. The chip body has an upper surface and a bottom surface. The via penetrates the chip body, and is exposed to the upper surface of the chip body. The passivation layer is disposed on the upper surface of the chip body, and the passivation layer has at least one opening. The opening exposes the via. The under ball metal layer is disposed in the opening of the passivation layer, and is connected to the via. The bump is disposed on the under ball metal layer, and comprises a first metal layer, a second metal layer and a third metal layer. The first metal layer is disposed on the under ball metal layer. The second metal layer is disposed on the first metal layer. The third metal layer is disposed on the second metal layer. The second chip is disposed on the first chip.

DETAILED DESCRIPTION OF THE INVENTION

Figure 2:
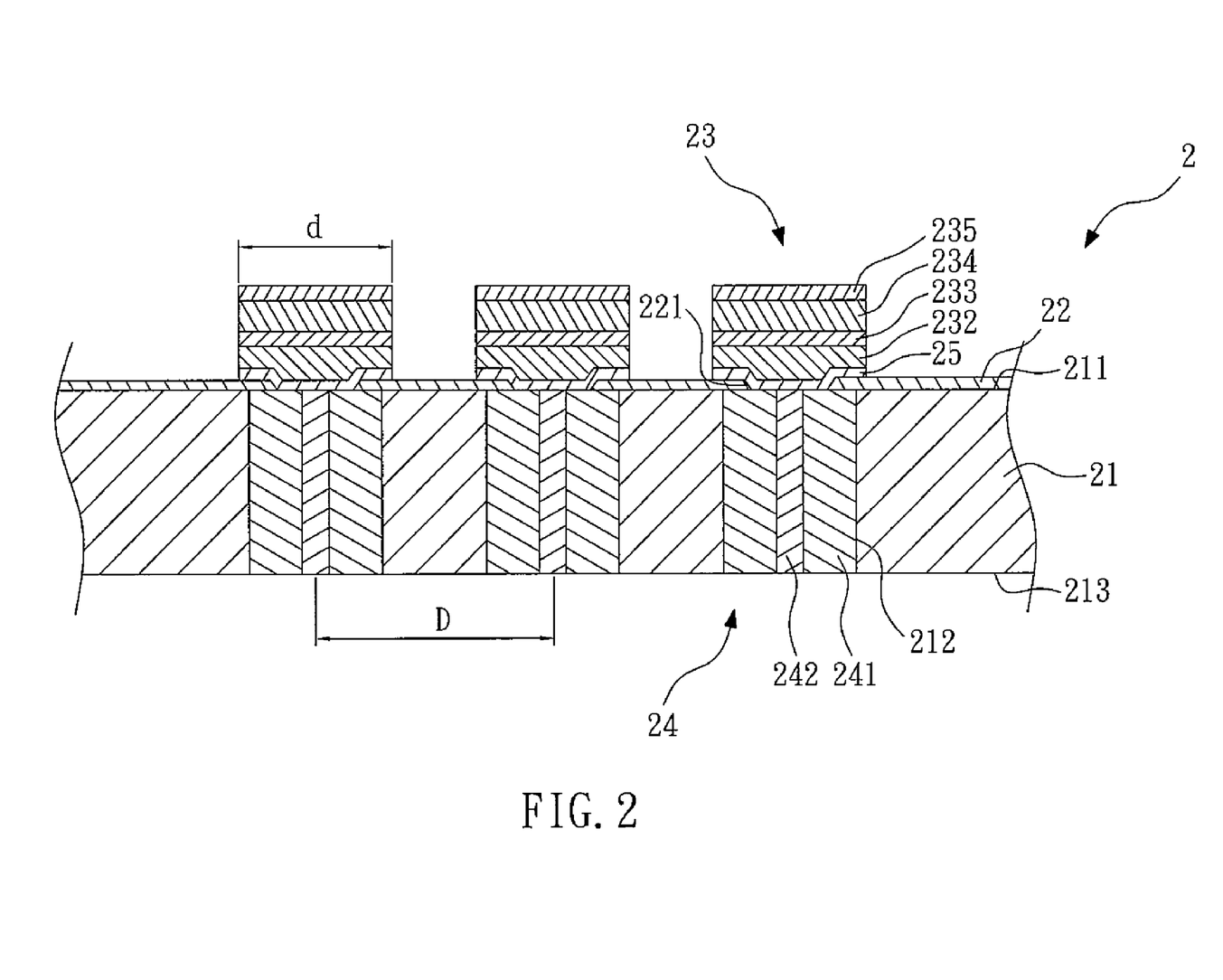
FIG. 2 is a cross-sectional view of a chip having a bump according to a first embodiment of the present invention.

FIG. 2 shows a cross-sectional view of a chip having a bump according to a first embodiment of the present invention. The chip 2 having a bump comprises a chip body 21, a passivation layer 22, an under ball metal layer 25 and at least one bump 23. The chip body 21 has a surface 211. In the embodiment, the chip body 21 is a dummy chip, and comprises a through hole 212 and a circuit layer (not shown). The circuit layer is disposed on the surface 211 of the chip body 21. However, in other applications, the chip body 21 may be a device chip, which further comprises an active surface, at least one pad and a CMOS image sensor (not shown). The pad is disposed in the chip body 21, and exposed to the active surface. The CMOS image sensor is disposed in the chip body 21, exposed to the active surface, and disposed at a position corresponding to the outside of the pad.

The passivation layer 22 is disposed on the surface 211 of the chip body 21, and the passivation layer 22 has at least one opening 221. The under ball metal layer 25 is disposed in the opening 221 of the passivation layer 22. In the embodiment, the material of the under ball metal layer 25 is titanium-copper (TiCu) alloy, and the under ball metal layer 25 is connected to the circuit layer. The bump 23 is disposed on the under ball metal layer 25, and the bump 23 comprises a first metal layer 232, a second metal layer 233, a third metal layer 234 and a fourth metal layer 235. The first metal layer 232 is disposed on the under ball metal layer 25. The second metal layer 233 is disposed on the first metal layer 232. The third metal layer 234 is disposed on the second metal layer 233. The fourth metal layer 235 is disposed on the third metal layer 234.

In the embodiment, the material of the third metal layer 234 is the same as that of the first metal layer 232, and is copper (Cu). The material of the second metal layer 233 is nickel (Ni), the material of the fourth metal layer 235 is tin-silver alloy. However, in other applications, the material of the fourth metal layer 235 may be tin (Sn). Preferably, the thickness of the first metal layer 232 is 7 µm, the thickness of the second metal layer 233 is 3 µm, the thickness of the third metal layer 234 is greater than 7 µm and the thickness of the fourth metal layer 235 is 3-5 µm.

In the embodiment, the chip 2 further comprises at least one via 24. The via 24 penetrates the chip body 21 and is exposed to the surface 211 of the chip body 21, and the under ball metal layer 25 is connected to the via 24. The via 24 comprises an insulation layer 241 and a conductor 242. The insulation layer 241 is disposed on the wall of the through hole 212 in the chip body 21, and the conductor 242 is disposed in the space enclosed by the insulation layer 241. In the embodiment, the distance between the central axes of two adjacent vias 24 is defined as a pitch D, and the diameter d of the bump 23 is preferably smaller than or equals to two-thirds of the pitch D, so as to avoid a short circuit caused by the interconnection of the bumps 23.

As the bumps 23 can connect two chips, the chip 2 is stackable, and so the density of the product is increased while the size of the product is reduced. Moreover, after the bump 23 undergoes a reflow process, if the second metal layer 233 diffuses to the first metal layer 232, part of the first metal layer 232 will be consumed, and an inter-material compound (IMC) will be formed. Meanwhile, the third metal layer 234 can be make up for the consumed amount of the first metal layer 232, and thus the bonding strength of the bump 23 is increased. Further, because of the via 24, the bump 23 can be formed on both the surface 211 and an opposite surface 213 of the chip body 21, and a stacking process can be conducted so as to reduce the size of the product.

Figure 3:
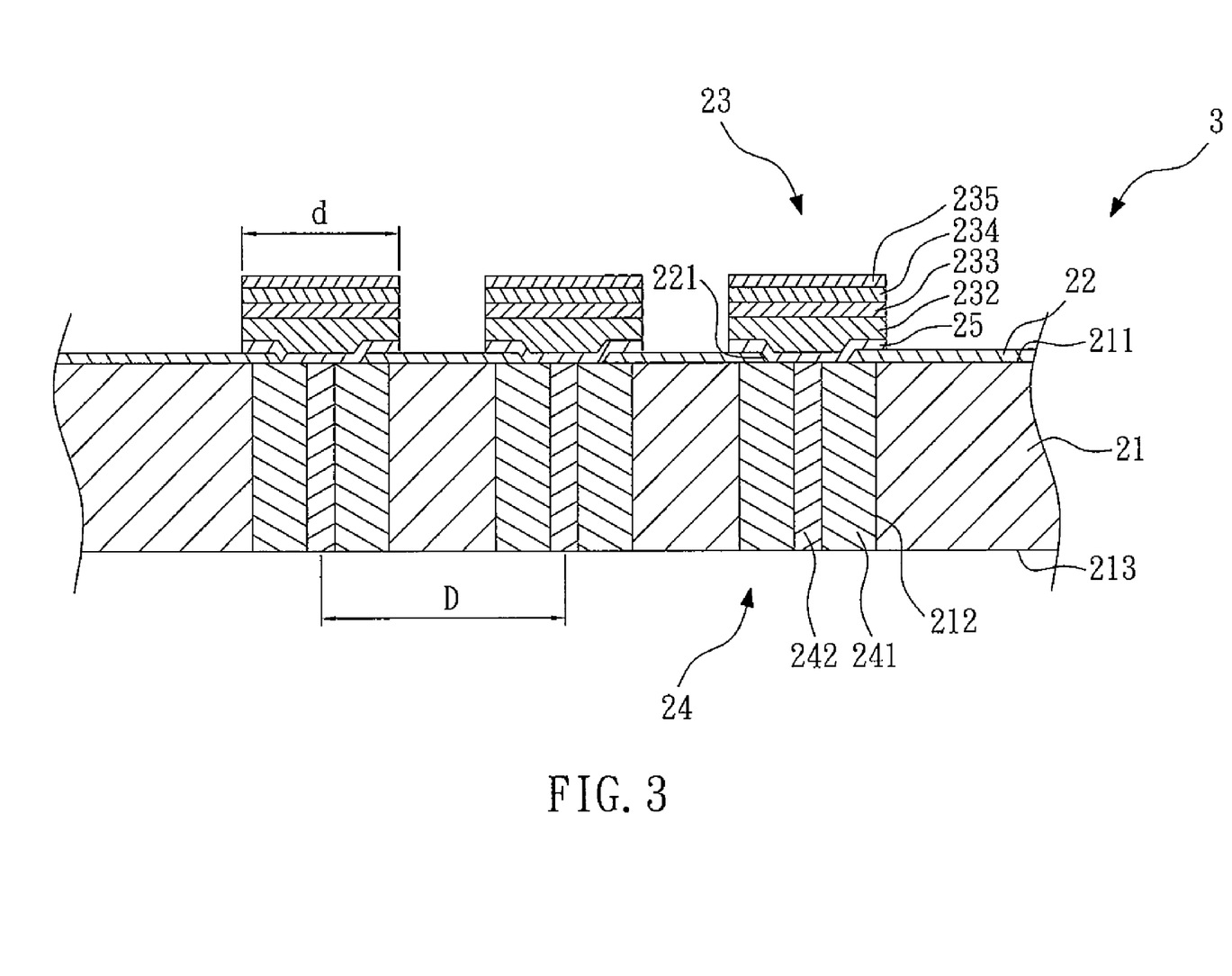
FIG. 3 is a cross-sectional view of a chip having a bump according to a second embodiment of the present invention.

FIG. 3 shows a cross-sectional view of a chip having a bump according to a second embodiment of the present invention. The chip 3 according to the second embodiment is substantially the same as the chip 2 (FIG. 2) according to the first embodiment, and the same elements are designated by the same reference numbers. The difference between the chip 3 according to the second embodiment and the chip 2 (FIG. 2) according to the first embodiment is that the material of the bump 23 of the chip 3 is different from that of the chip 2. In the embodiment, the material of the third metal layer 234 is different from that of the first metal layer 232. The material of the first metal layer 232 is copper (Cu), the material of the second metal layer 233 is nickel (Ni), the material of the third metal layer 234 is tin (Sn) or tin-silver alloy, and the material of the fourth metal layer 235 is gold (Au). Preferably, the thickness of the first metal layer 232 is 7 µm, the thickness of the second metal layer 233 is 3 µm, the thickness of the third metal layer 234 is 3-4 µm, and the thickness of the fourth metal layer 235 is 0.5 µm. The fourth metal layer 235 can prevent the first metal layer 232, the second metal layer 233 and the third metal layer 234 from being oxidized. Moreover, when a die bonder picks up the die 3 for heating, the fourth metal layer 235 (gold layer) can prevent the die 3 from being stuck to the die bonder.

Figure 4:
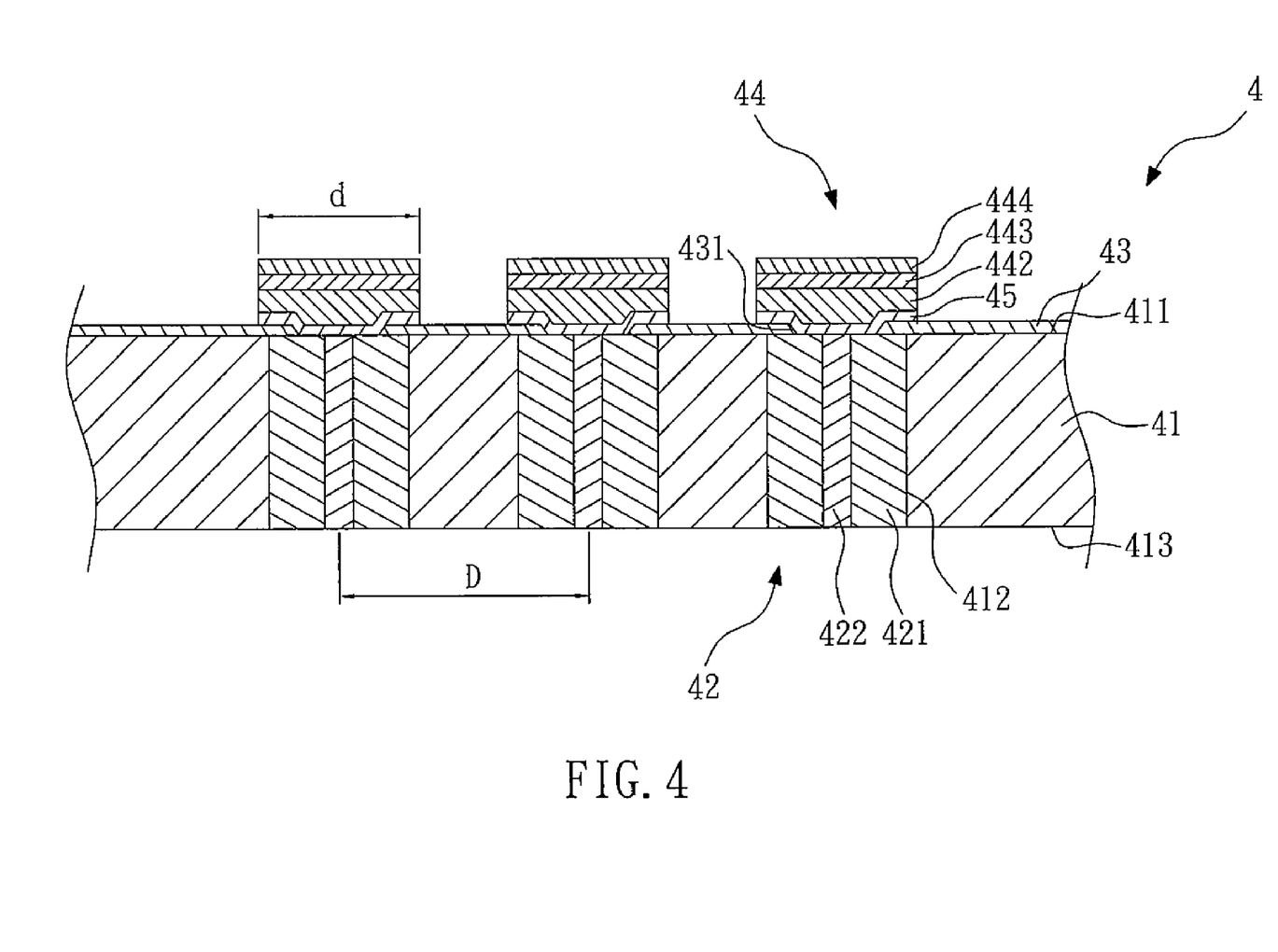
FIG. 4 is a cross-sectional view of a chip having a bump according to a third embodiment of the present invention.

FIG. 4 shows a cross-sectional view of a chip having a bump according to a third embodiment of the present invention. The chip 4 comprises a chip body 41, at least one via 42, a passivation layer 43, an under ball metal layer 45 and at least one bump 44. The chip body 41 has a surface 411. In the embodiment, the chip body 41 is a dummy chip, and further comprises a through hole 412. However, in other applications, the chip body 41 may be a device chip, which further comprises an active surface, at least one pad and a CMOS image sensor (not shown). The pad is disposed in the chip body 41, and exposed to the active surface. The CMOS image sensor is disposed in the chip body 41, exposed to the active surface, and disposed at a position corresponding to the outside of the pad.

The via 42 penetrates the chip body 41, and is exposed to the surface 411 of the chip body 41. In the embodiment, the via 42 comprises an insulation layer 421 and a conductor 422. The insulation layer 421 is disposed on the wall of the through hole 412 of the chip body 41, and the conductor 422 is disposed in the space enclosed by the insulation layer 421. In the embodiment, the distance between the central axes of two adjacent vias 42 is defined as a pitch D, and the diameter d of the bump 44 is preferably smaller than or equals to two-thirds of the pitch D, so as to avoid a short circuit caused by the interconnection of the bumps 44. The passivation layer 43 is disposed on the surface 411 of the chip body 41, and the passivation layer 43 has at least one opening 431. The opening 431 exposes the via 42. The under ball metal layer 45 is disposed in the opening 431 of the passivation layer 43, and is connected to the via 42. In the embodiment, the material of the under ball metal layer 45 is titanium-copper (TiCu) alloy.

The bump 44 is disposed on the under ball metal layer 45. The bump 44 comprises a first metal layer 442, a second metal layer 443 and a third metal layer 444. The first metal layer 442 is disposed on the under ball metal layer 45. The second metal layer 443 is disposed on the first metal layer 442. The third metal layer 444 is disposed on the second metal layer 443. In the embodiment, the material of the first metal layer 442 is copper (Cu), the material of the second metal layer 443 is nickel (Ni), and the material of the third metal layer 444 is tin (Sn) or tin-silver alloy. Preferably, the thickness of the first metal layer 442 is 7 µm, the thickness of the second metal layer 443 is 3 µm, and the thickness of the third metal layer 444 is 2 µm. In other applications, the chip 4 further comprises a circuit layer. The circuit layer is disposed on the surface 211 of the chip body 21, and the under ball metal layer 45 is connected to the circuit layer.

Because of the via 42, the bump 44 can be formed on both the surface 411 and an opposite surface 413 of the chip body 41, and a stacking process can be conducted so as to reduce the size of the product.

Figure 5:
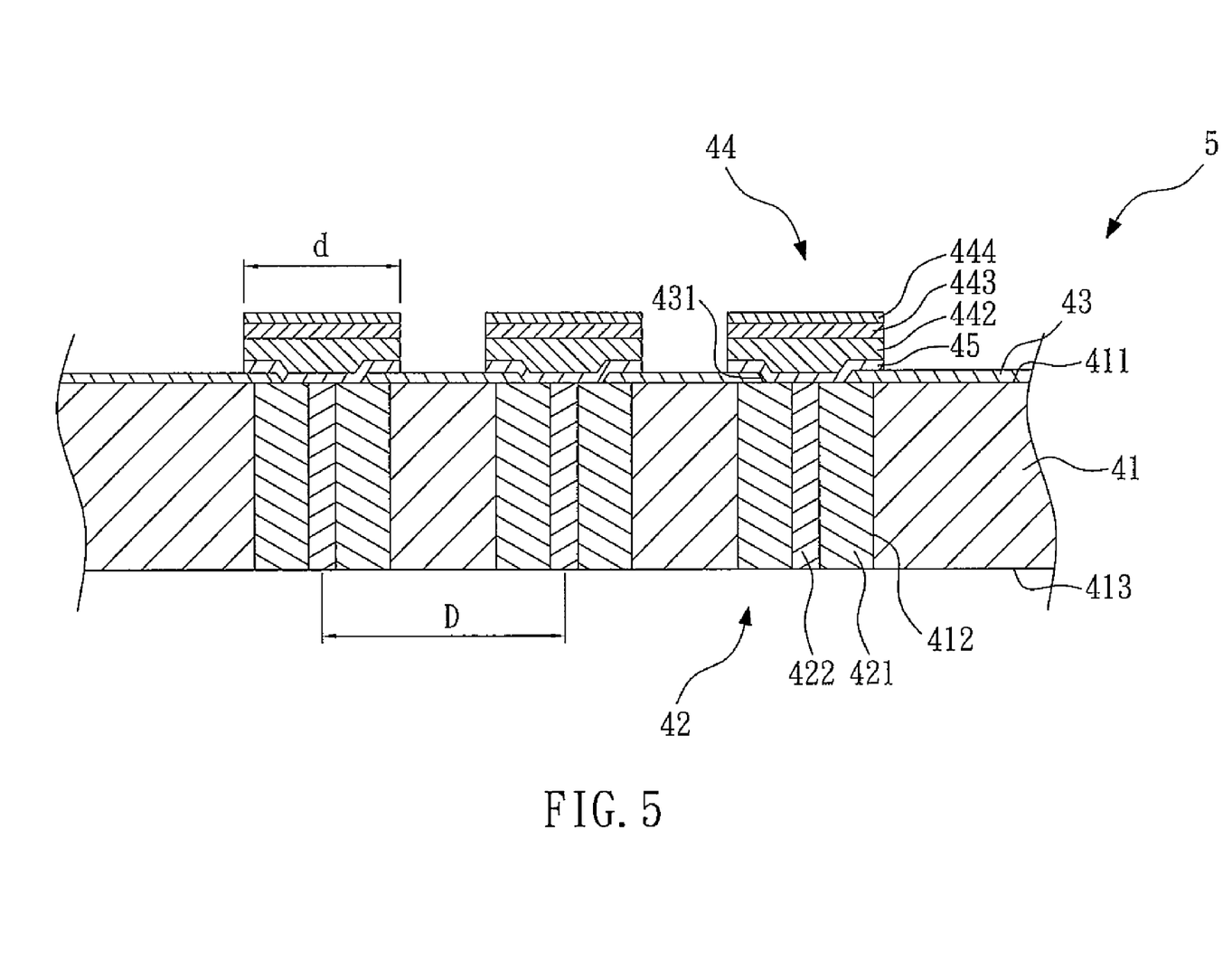
FIG. 5 is a cross-sectional view of a chip having a bump according to a fourth embodiment of the present invention.

FIG. 5 shows a cross-sectional view of a chip having a bump according to a fourth embodiment of the present invention. The chip 5 according to the fourth embodiment is substantially the same as the chip 4 (FIG. 4) according to the third embodiment, and the same elements are designated by the same reference numbers. The difference between the chip 5 according to the fourth embodiment and the chip 4 (FIG. 4) according to the third embodiment is that the material of the bump 44 of the chip 5 is different from that of the chip 4. In the embodiment, the material of the first metal layer 442 is copper (Cu), the material of the second metal layer 443 is nickel (Ni), and the material of the third metal layer 444 is gold (Au). Preferably, the thickness of the first metal layer 442 is 7 µm, the thickness of the second metal layer 443 is 3 µm, and the thickness of the third metal layer 444 is 0.5 µm. When a die bonder picks up the die 5 for heating, the third metal layer 444 (gold layer) can prevent the die 5 from being stuck to the die bonder.

Figure 6:
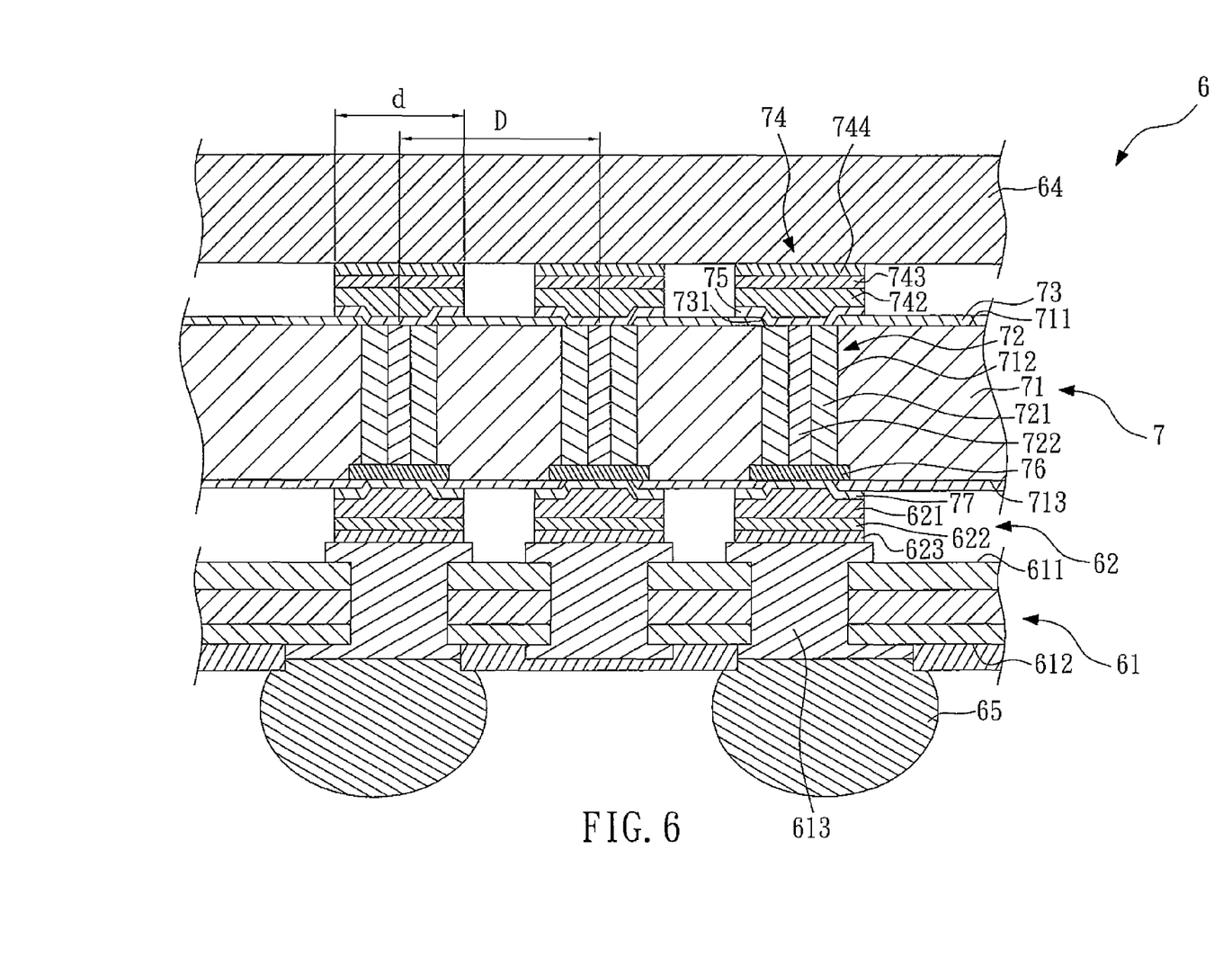
FIG. 6 is a cross-sectional view of a package having a chip with a bump according to the present invention.

FIG. 6 shows a cross-sectional view of a package having a chip with a bump according to the present invention. The package 6 comprises a substrate 61, at least one electrical connector 62, a first chip 7, a second chip 64 and a plurality of solder balls 65. The substrate 61 has an upper surface 611 and a bottom surface 612. In the embodiment, the substrate 61 further comprises at least one conducting hole 613. The conducting hole 613 penetrates the substrate 61, and is exposed to the upper surface 611 and the bottom surface 612 of the substrate 61. The electrical connector 62 is disposed on the upper surface 611 of the substrate 61. In the embodiment, the electrical connector 62 is a bump. However, in other applications, the electrical connector 62 may be a solder ball.

The first chip 7 is disposed on the electrical connector 62, and comprises a chip body 71, at least one via 72, a passivation layer 73, an under ball metal layer 75 and at least one bump 74. The chip body 71 has an upper surface 711 and a bottom surface 713. The bottom surface 713 is an active surface which is opposite the upper surface 711 of the chip body 71. In the embodiment, the chip body 71 is a device chip, and further comprises at least one pad 76 and a through hole 712. The pad 76 is disposed in the chip body 71, and exposed to the bottom surface 713. However, in other applications, the chip body 71 may be a dummy chip.

The via 72 penetrates the chip body 71, one end of the via 72 is exposed to the upper surface 711 of the chip body 71, and the other end of the via 72 is connected to the pad 76. In the embodiment, the via 72 comprises an insulation layer 721 and a conductor 722. The insulation layer 721 is disposed on the wall of the through hole 712 of the chip body 71, and the conductor 722 is disposed in the space enclosed by the insulation layer 721. In the embodiment, the distance between the central axes of two adjacent vias 72 is defined as a pitch D, and the diameter d of the bump 74 is preferably smaller than or equals to two-thirds of the pitch D, so as to avoid a short circuit caused by the interconnection of the bumps 74.

The passivation layer 73 is disposed on the upper surface 711 of the chip body 71, and the passivation layer 73 has at least one opening 731. The opening 731 exposes the via 72. The under ball metal layer 75 is disposed in the opening 731 of the passivation layer 73, and is connected to the via 72. In the embodiment, the material of the under ball metal layer 75 is titanium-copper (TiCu) alloy.

The bump 74 is disposed on the under ball metal layer 75. The bump 74 comprises a first metal layer 742, a second metal layer 743 and a third metal layer 744. The first metal layer 742 is disposed on the under ball metal layer 75. The second metal layer 743 is disposed on the first metal layer 742. The third metal layer 744 is disposed on the second metal layer 743. In the embodiment, the material of the first metal layer 742 is copper (Cu), the material of the second metal layer 743 is nickel (Ni), and the material of the third metal layer 744 is tin (Sn) or tin-silver alloy. Preferably, the thickness of the first metal layer 742 is 7 µm, the thickness of the second metal layer 743 is 3 µm, and the thickness of the third metal layer 744 is 2 µm.

In the embodiment, the first chip 7 further comprises an under ball metal layer 77. The under ball metal layer 77 is disposed on the bottom surface 713, and is connected to the pad 76. The electrical connector 62 is a bump, and disposed on the under ball metal layer 77. The electrical connector 62 comprises a fourth metal layer 621, a fifth metal layer 622 and a sixth metal layer 623. The fourth metal layer 621 is the same as the first metal layer 742, the fifth metal layer 622 is the same as the first metal layer 743, and the sixth metal layer 623 is the same as the third metal layer 744.

In other applications, the first chip 7 further comprises a CMOS image sensor (not shown) and a circuit layer (not shown). The CMOS image sensor is disposed in the chip body 71, exposed to the bottom surface 713, and disposed at a position corresponding to the outside of the pad 76. The circuit layer is disposed on the upper surface 711 of the chip body 71, and the under ball metal layer 75 is connected to the circuit layer.

The second chip 64 is disposed on the first chip 7, and is connected to the third metal layer 744. In the embodiment, the second chip 64 is a flip chip. However, in other applications, the second chip 64 may have at least one via. The solder balls 65 are disposed on the bottom surface 612 of the substrate 61.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms illustrated, and that all modifications which maintain the spirit and scope of the present invention are within the scope defined by the appended claims.

What is claimed is:

1. A chip having a bump, comprising:
   a chip body, having a surface;
   at least one via, penetrating the chip body and exposed to the surface of the chip body, wherein the distance between the central axes of two adjacent vias is defined as a pitch;
   a passivation layer, disposed on the surface of the chip body, wherein the passivation layer has at least one opening, and the opening exposes the via;
   an under ball metal layer (UBM), disposed in the opening of the passivation layer, and connected to the via; and
   at least one bump, disposed on the under ball metal layer, wherein the diameter of the bump is smaller than or equals to two-thirds of the pitch, and the bump comprises:
   a first metal layer, disposed on the under ball metal layer, wherein the material of the first metal layer is copper (Cu);
   a second metal layer, disposed on the first metal layer, wherein the material of the second metal layer is nickel (Ni); and
   a third metal layer, disposed on the second metal layer, wherein the material of the third metal layer is tin (Sn), tin-silver alloy or gold (Au).

2. The chip as claimed in claim 1, wherein the material of the under ball metal layer is titanium-copper (TiCu) alloy.

3. The chip as claimed in claim 1, wherein the thickness of the first metal layer is 7 µm, the thickness of the second metal layer is 3 µm, and the thickness of the third metal layer is 2 µm.

4. The chip as claimed in claim 1, wherein the thickness of the first metal layer is 7 µm, the thickness of the second metal layer is 3 µm, and the thickness of the third metal layer is 0.5 µm.

5. The chip as claimed in claim 1, further comprising a fourth metal layer disposed between the second metal layer and the third metal layer.

6. The chip as claimed in claim 5, wherein the material of the fourth metal layer is the same as that of the first metal layer.

7. The chip as claimed in claim 5, wherein the material of the first metal layer is copper (Cu), the material of the second metal layer is nickel (Ni), the material of the fourth metal layer is tin (Sn) or tin-silver alloy, and the material of the third metal layer is gold (Au).

8. The chip as claimed in claim 5, wherein the thickness of the first metal layer is 7 μm, the thickness of the second metal layer is 3 μm, the thickness of the fourth metal layer is greater than 7 μm, and the thickness of the third metal layer is 3-5 μm.

9. The chip as claimed in claim 5, wherein the thickness of the first metal layer is 7 μm, the thickness of the second metal layer is 3 μm, the thickness of the fourth metal layer is greater than 3-4 μm, and the thickness of the third metal layer is 0.5 μm.

10. A chip having a bump, comprising:
a chip body, having a surface;
at least one via, penetrating the chip body and exposed to the surface of the chip body, wherein the distance between the central axes of two adjacent vias is defined as a pitch;
a passivation layer, disposed on the surface of the chip body, wherein the passivation layer has at least one opening, and the opening exposes the via;
an under ball metal layer (UBM), disposed in the opening of the passivation layer, and connected to the via; and
at least one bump, disposed on the under ball metal layer, wherein the diameter of the bump is smaller than or equals to two-thirds of the pitch, and the bump comprises:
a first metal layer, disposed on the under ball metal layer;
a second metal layer, disposed on the first metal layer;
a third metal layer, disposed on the second metal layer; and
a fourth metal layer disposed between the second metal layer and the third metal layer, wherein the material of the fourth metal layer is the same as that of the first metal layer.

11. The chip as claimed in claim 10, wherein the material of the under ball metal layer is titanium-copper (TiCu) alloy.

12. The chip as claimed in claim 10, wherein the thickness of the first metal layer is 7 μm, the thickness of the second metal layer is 3 μm, and the thickness of the third metal layer is 2 μm.

13. The chip as claimed in claim 10, wherein the material of the first metal layer and the fourth metal layer is copper (Cu), the material of the second metal layer is nickel (Ni), and the material of the third metal layer is tin (Sn) or tin-silver alloy.

14. The chip as claimed in claim 10, wherein the thickness of the first metal layer is 7 μm, the thickness of the second metal layer is 3 μm, the thickness of the fourth metal layer is greater than 7 μm, and the thickness of the third metal layer is 3-5 μm.

15. The chip as claimed in claim 10, wherein the thickness of the first metal layer is 7 μm, the thickness of the second metal layer is 3 μm, the thickness of the fourth metal layer is greater than 3-4 μm, and the thickness of the third metal layer is 0.5 μm.

16. A chip having a bump, comprising:
a chip body, having a surface;
at least one via, penetrating the chip body and exposed to the surface of the chip body, wherein the distance between the central axes of two adjacent vias is defined as a pitch;
a passivation layer, disposed on the surface of the chip body, wherein the passivation layer has at least one opening, and the opening exposes the via;
an under ball metal layer (UBM), disposed in the opening of the passivation layer, and connected to the via; and
at least one bump, disposed on the under ball metal layer, wherein the diameter of the bump is smaller than or equals to two-thirds of the pitch, and the bump comprises:
a first metal layer, disposed on the under ball metal layer, wherein the material of the first metal layer is copper (Cu);
a second metal layer, disposed on the first metal layer, wherein the material of the second metal layer is nickel (Ni)
a third metal layer, disposed on the second metal layer, wherein the material of the third metal layer is gold (Au); and
a fourth metal layer disposed between the second metal layer and the third metal layer, wherein the material of the fourth metal layer is tin (Sn) or tin-silver alloy.

17. The chip as claimed in claim 16, wherein the material of the under ball metal layer is titanium-copper (TiCu) alloy.

18. The chip as claimed in claim 16, wherein the thickness of the first metal layer is 7μm, the thickness of the second metal layer is 3 μm, and the thickness of the third metal layer is 2μm.

19. The chip as claimed in claim 16, wherein the thickness of the first metal layer is 7μm, the thickness of the second metal layer is 3 μm, the thickness of the fourth metal layer is greater than 7 μm, and the thickness of the third metal layer is 3-5 μm.

20. The chip as claimed in claim 16, wherein the thickness of the first metal layer is 7μm, the thickness of the second metal layer is 3 μm, the thickness of the fourth metal layer is greater than 3-4 μm, and the thickness of the third metal layer is 0.5 μm.

* * * * *